United States Patent [19]

Mrozowski et al.

[11] 4,222,107
[45] Sep. 9, 1980

[54] METHOD AND APPARATUS FOR AUTOMATICALLY CALIBRATING A DIGITAL TO ANALOG CONVERTER

[75] Inventors: Andrij Mrozowski; Jimmy R. Naylor; Paul R. Prazak, all of Tucson, Ariz.

[73] Assignee: Burr-Brown Research Corporation, Tucson, Ariz.

[21] Appl. No.: 5,357

[22] Filed: Jan. 22, 1979

[51] Int. Cl.³ .............................................. H03K 13/02
[52] U.S. Cl. ............................... 364/571; 340/347 CC
[58] Field of Search ................... 364/571; 340/347 CC

[56] References Cited

U.S. PATENT DOCUMENTS

| 3,889,255 | 6/1975 | Pettersen | 340/347 CC |
| 3,961,325 | 6/1976 | Kendall et al. | 340/347 CC X |
| 4,070,707 | 1/1978 | Barber | 340/347 CC X |

Primary Examiner—Edward J. Wise
Attorney, Agent, or Firm—Cahill, Sutton & Thomas

[57] ABSTRACT

A system for automatically calibrating a main digital to analog converter (DAC) includes first and second adjustment DAC's, an offset DAC, a difference amplifier, an analog to digital converter (ADC), a microprocessor, and an analog switch. To calibrate the offset of the main DAC, the microprocessor causes "zeros" to be applied to the digital inputs of the main DAC and the offset DAC. The output of the offset DAC is coupled to an input of the difference amplifier. The microprocessor causes a ground voltage to be applied to the second input of the difference amplifier via the analog switch. The output of the difference amplifier is inputted to the ADC, which produces a first word. The first word is stored by the microprocessor. The analog switch is activated to apply the analog output voltage of the main DAC to the second input of the difference amplifier. The ADC produces a second word which is compared to the first word. The microprocessor computes a first correction word which is transmitted to the first adjustment DAC. The first adjustment DAC produces a corresponding analog signal which is applied to a first correction input of the main DAC, causing the analog output voltage to be adjusted toward the ground voltage. To calibrate the linearity of the main DAC, the microprocessor causes the analog voltage corresponding to the fourth most significant bit to be converted to a third digital word by means of the ADC, and then causes the analog output voltage corresponding to the sum of the less significant bits to be converted to a fourth word by means of the ADC. The difference between the third and fourth words is used by the microprocessor to compute a second correction code. The second correction code is converted to a second analog correction signal by the second DAC, causing the third analog output voltage to differ from the second analog output voltage by an amount corresponding to one least significant bit.

31 Claims, 5 Drawing Figures

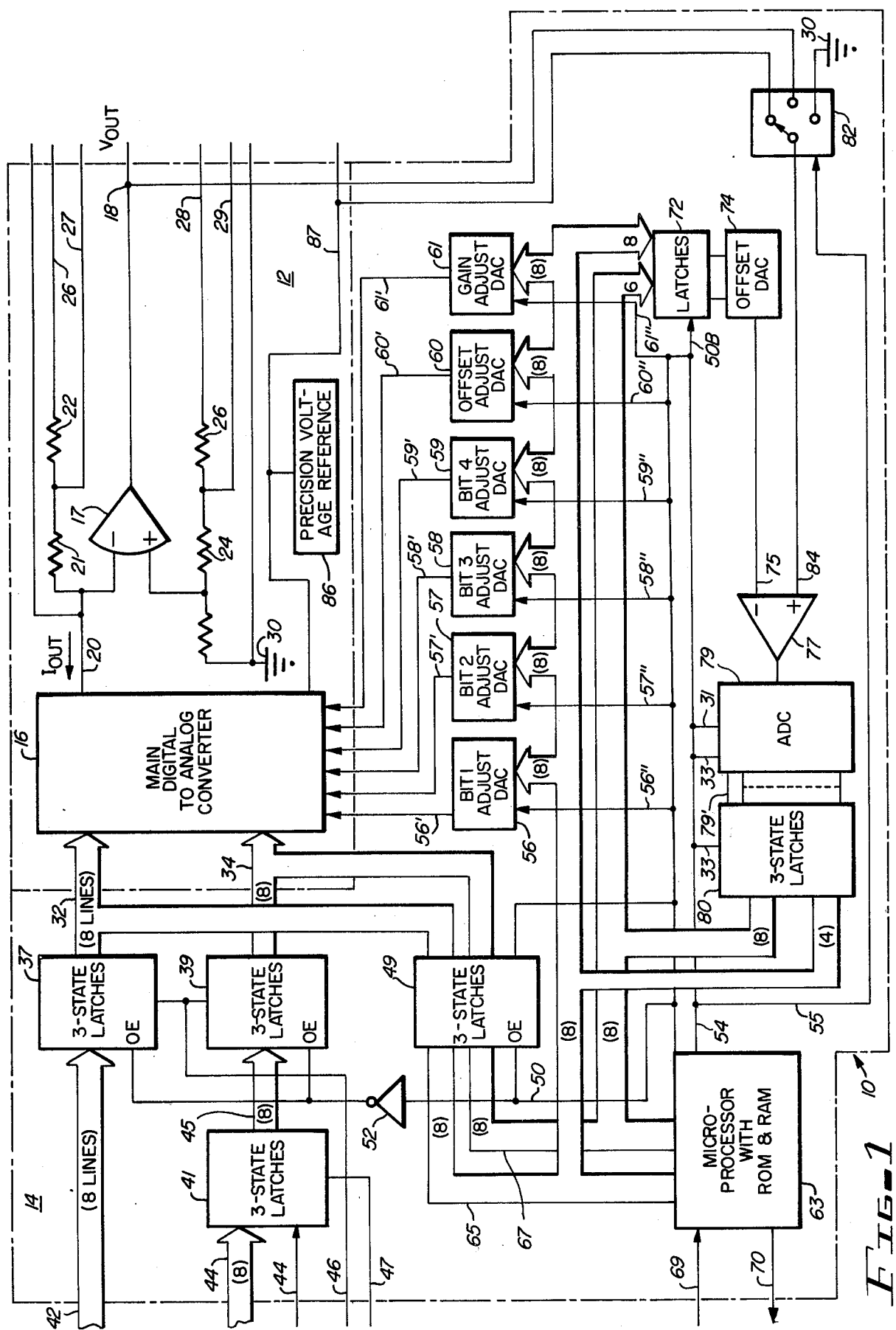

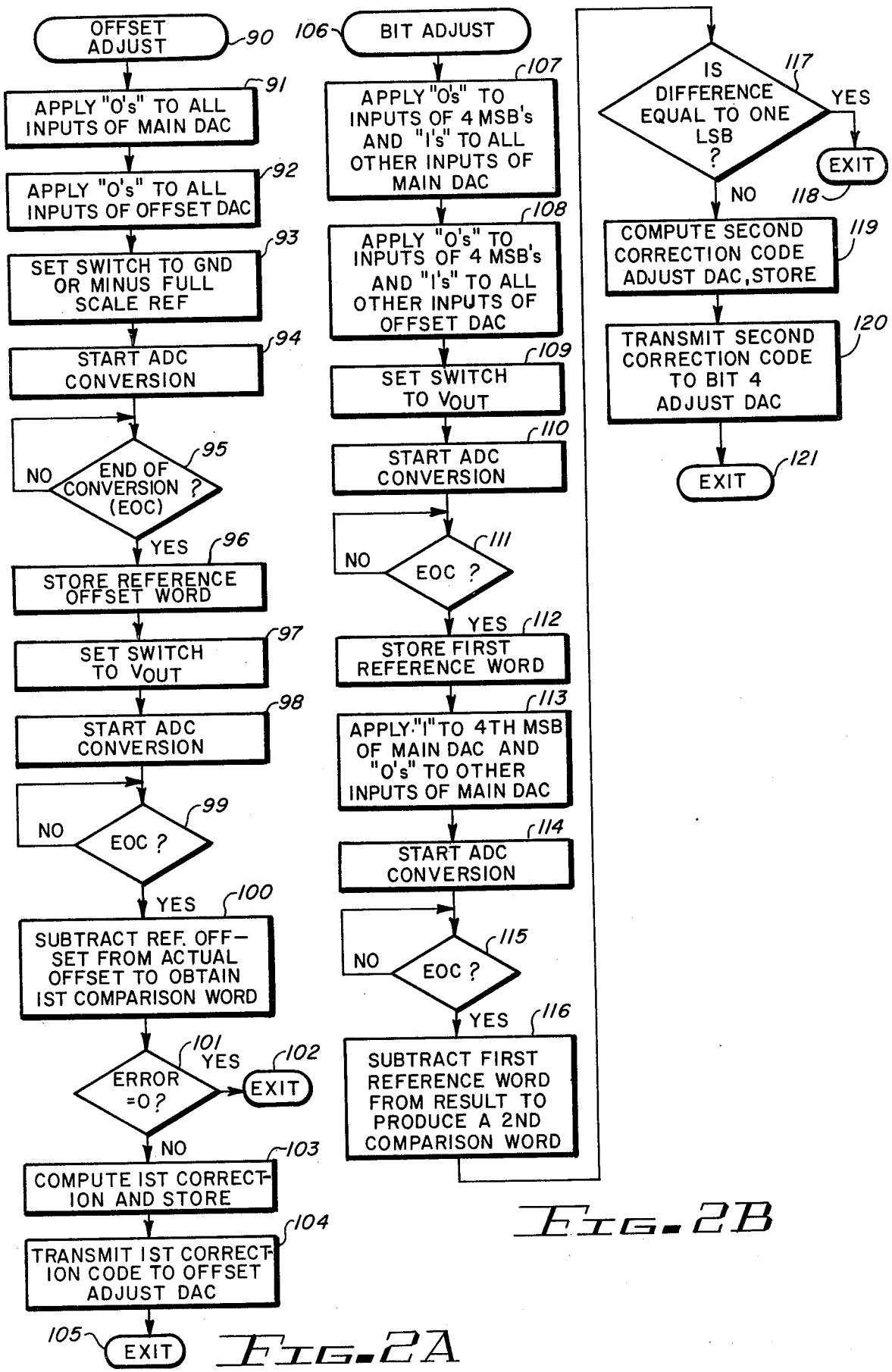

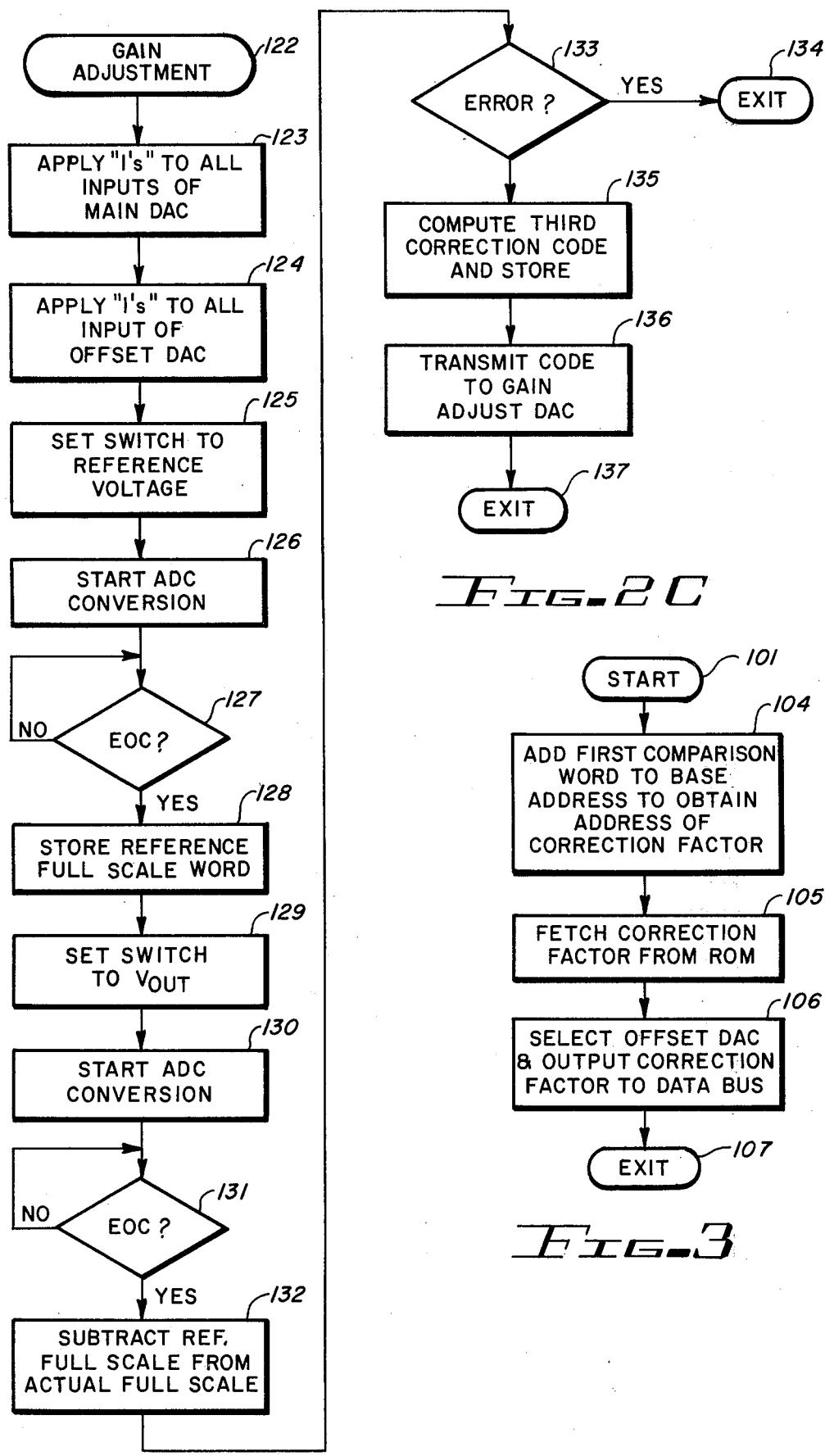

METHOD AND APPARATUS FOR AUTOMATICALLY CALIBRATING A DIGITAL TO ANALOG CONVERTER

BACKGROUND OF THE INVENTION

1. Field of the Invention

The invention relates to digital to analog converters, particularly to processor controlled systems for automatically calibrating digital to analog converters.

2. Description of the Prior Art

Digital to analog converters (DAC's) are widely utilized in the electronics industry to convert digital words into analog output signals representing the value of the digital word. At the present state of the art, it is quite feasible to manufacture accurate twelve bit or ten bit DAC's utilizing monolithic integrated circuit technology and/or hybrid integrated circuit technology. However, more accurate DAC's, (e.g., having thirteen bit accuracy or more) for example, sixteen bit DAC's, are much more expensive to manufacture. Careful internal thermal design of hybrid integrated circuit sixteen bit DAC's is necessary to minimize "superposition errors". Superposition errors arise from a number of causes, including thermal variations produced by quiescent power levels changing for different operating conditions in the integrated circuit structure and non-zero temperature coefficients or tracking of temperature coefficients of various components in the integrated circuit structure. Limitations on accuracy of present state of the art sixteen bit DAC's arise from errors in gain, offset voltages, and non-linearities in the four to six most significant bits. Presently, available sixteen bit DAC's include a large number of adjustment or "trimming" potentiometers which can be adjusted to calibrate the four most significant bits to compensate for errors in offset, linearity, and gain. A well known technique for performing such calibration involves electrically isolating a sixteen bit DAC from an electronic system in which it operates, and manually adjusting appropriate ones of the above mentioned potentiometers to adjust the output voltage of the DAC to produce zero voltage, as measured by a six and one-half digit digital volt meter when all the digital inputs to the DAC are logical "zeros". Then each of the four most significant bits is adjusted by manually adjusting others of the potentiometers to produce an output voltage difference corresponding to "one least significant bit" voltage differences between each of the four most significant bits and the respective sums of all less significant bits. Finally, the gain of the DAC is adjusted by applying all "ones" to the digital inputs of the DAC and adjusting a gain potentiometer to produce a predetermined full scale output voltage. The foregoing manual adjustment procedure has several serious shortcomings. First, the electronic system in which the DAC operates must be electrically disconnected or isolated from the DAC. This, of course, involves "down time" for the electronics system.

Accordingly, it is an object of the invention to provide a digital to analog converter which can be calibrated with minimum interruption of an electronics system in which the digital to analog converter is operatively connected.

A large number of adjustment potentiometers must be adjusted to accomplish accurate calibration of presently available high accuracy sixteen bit digital to analog converters. Further, expensive calibration equipment is required, such as a six and one-half digit digital volt meter costing approximately $4000. The average time for a skilled technician to calibrate present sixteen bit DAC's ranges from at least 10 minutes to well over half an hour.

It is another object of the invention to provide a method and apparatus for calibrating a digital to analog converter connected in an electronic system, which method and apparatus require a minimum number of manual adjustments and which require utilization of a minimum amount of low cost external equipment to accomplish the calibration procedure.

Presently available sixteen bit DAC's are very expensive, due to the high cost in fabricating devices with the proper thermal design, precision matching of integrated circuit components, and manufacture of high accuracy, low temperature coefficient bulk metal film resistors utilized in precision ladder resistor networks required for the four most significant bits. The cost of the numerous trim potentiometers is also quite high, as they may range in cost from $1 to more than $3 or $4.

It is therefore another object of the invention to provide a low cost digital to analog converter having a resolution of at least sixteen bits and having correspondingly high accuracy.

It is another object of the invention to provide an automatic digital to analog converter calibration system.

Another shortcoming of even the best of the presently available digital to analog converters having greater than approximately twelve bit accuracy is the fact that accuracy is lost due to "drift" of component characteristics with both time and temperature. At the present state of the art, a sixteen bit high accuracy DAC must be recalibrated at least every three months, providing that the temperature range to which the DAC is subjected varies only by less than 10° C. Any time that the temperature varies by more than 10° C., accuracy is lost and the DAC must be immediately recalibrated.

It is yet another object of the invention to provide a high accuracy digital to analog converter device which can operate continuously with high accuracy over a wide temperature range.

There are many applications for DAC's wherein it is highly necessary that the output voltage of the DAC be monotonic, that is, the output always increases as the value of the digital input word applied to the digital inputs of the DAC increases, and wherein the output always decreases as the value of the digital input word decreases. This condition is present if the DAC has appropriately small non-linearity errors and superposition errors. However, the gain accuracy of a DAC frequently is less important than the linearity accuracy or monotonicity thereof, due to the fact that DAC's are commonly utilized in applications wherein comparison of a test signal with a control signal is made; under such conditions, linearity or relative accuracy is of primary importance. Thus, in such applications, it is highly desirable that the linearity of the DAC can be quickly and conveniently calibrated and recalibrated without making any external adjustments, without using any external reference voltage source, and without electrically isolating the DAC from the system in which it normally operates. Those skilled in the art will appreciate that if a digital to analog converter appears in a digital loop (for example, in a numerically controlled machine tool), non-monotonicity of the DAC could cause a control processor to produce an erroneous result or enter into a diagnostic routine or an "infinite loop".

It is therefore an object of the invention to provide a digital to analog converter of low cost wherein monotonicity of linearity can be automatically established by recalibration without use of any external reference.

SUMMARY OF THE INVENTION

Briefly described, and in accordance with one embodiment thereof, the invention provides a method and system for automatically calibrating a digital to analog converter without requiring that the digital to analog converter be physically disconnected from an electronic system incorporating the digital to analog converter and without requiring use of an external reference source.

The described calibration system includes a set of three-state latches having inputs coupled to conductors of the electronic system for receiving an input word for conversion to an analog output signal. A processor system controls the latches to apply the input word to the digital inputs of a sixteen bit main digital to analog converter (DAC) during normal operation of the electronic system. The main DAC includes a plurality of "bit adjustment" inputs for trimming the weight of an output signal corresponding to each of the bits that have "bit adjustment" inputs. The main DAC also includes an "offset adjustment" input and a "gain adjustment" input for adjusting the offset and gain, respectively, of the main DAC. A plurality of "bit adjustment" DAC's, an "offset adjustment" DAC, and a "gain adjustment" DAC, each having input latches, have the outputs connected to the "bit adjustment", "offset adjustment", and "gain adjustment" inputs, respectively, of the main DAC. The calibration system includes a precision voltage reference which contributes to the full scale reading of the output signal of the main DAC. The main DAC has sixteen bits, the lowest twelve of which are sufficiently accurate without calibration. The four "bit adjustment" DAC's, the "offset adjustment" and "gain adjustment" DAC's each have "eight bit" accuracy. The calibration system also includes a fourteen bit "offset" DAC and an analog switch of the single pole, triple throw type having outputs respectively coupled to the two inputs of a difference amplifier. The difference amplifier output is connected to the input of an analog to digital converter (ADC) which converts the amplified difference between the output voltages of the "offset" DAC and the analog switch to a digital word, which can then be inputted to the microprocessor.

During the calibration process, the microprocessor electrically isolates the inputs of the main DAC from the outputs of the input latches and applies "zeros" to all of the inputs of the main DAC and also to the inputs of the "offset adjustment" DAC and the "offset" DAC. The microprocessor also controls the analog switch to electrically connect its output to a ground or reference potential. The difference between the output of the "offset" DAC and the ground potential is converted to a first digital word which is received and stored by the microprocessor. The microprocessor causes the analog switch to couple the output voltage of the main DAC to one input of the difference amplifier. The analog to digital (ADC) converter produces a second digital word which is compared with the first digital word. The microprocessor then computes a first correction code and inputs the first correction code to the "offset adjustment" DAC, which produces a first correction signal to the "offset adjustment" input of the main DAC, causing the output voltage of the main DAC to be adjusted toward the ground potential or reference potential, thereby calibrating the "offset" of the main DAC.

Next, the microprocessor applies "zeros" to the four most significant bits of the main DAC and the offset DAC and "ones" to the other inputs thereof, and applies the output of the main DAC to the input of the difference amplifier by means of the analog switch, causing a third digital word to be produced by the ADC. The third digital word is stored by the microprocessor, which then applies a "one" to the fourth bit of the main DAC and "zeros" to all other inputs thereof. (The code to the offset DAC is not changed). The ADC produces a fourth digital word which is compared with the stored third digital word. The microprocessor compares the difference between the third and fourth digital words with a predetermined quantity representative of the difference in output voltage of the main DAC corresponding to a single "least significant bit change" in the value of the digital input word represented by the digital inputs of the main DAC. A second correction code is computed by the microprocessor and inputted to the "bit adjustment" DAC for bit 4 of the main DAC, which "bit adjustment" DAC produces a second analog correction signal, causing the output voltage of the main DAC to be adjusted to a value which is precisely one "least significant bit voltage" different from the second output voltage. The three remaining most significant bits are sequentially calibrated in like manner in increasing order. Finally, the microprocessor applies "ones" to all of the inputs of the main DAC, and the "offset" DAC, and controls the analog switch, causing the precision voltage reference and the output of the main DAC to be applied to one input of the difference amplifier, and causing fourth and fifth digital words corresponding to the value of the precision voltage reference and the output voltage of the main DAC, respectively, to be compared. A corresponding correction code is inputted from the microprocessor to the "gain adjustment" DAC, which produces an analog correction signal causing the output voltage to be adjusted toward the voltage of the precision voltage reference.

DESCRIPTION OF THE DRAWINGS

FIG. 1 is a detailed block diagram of one embodiment of the present invention.

FIGS. 2A–2C constitute a flow chart useable in explaining the operation of the system of FIG. 1.

FIG. 3 constitutes a flow chart useful in describing the computation of correction codes made by the microprocessor of FIG. 1.

DESCRIPTION OF THE INVENTION

The method and apparatus of the present invention can be best understood by first referring to the structure of system 10 in FIG. 1, which includes a digital to analog converter (DAC) subsystem 12. DAC subsystem 12 includes a main DAC 16 having an output terminal 20 and sixteen digital inputs connected to the respective conductors of eight bit buses 32 and 34. DAC subsystem 12 includes output circuitry including an operational amplifier 17 having a negative input connected to terminal 20 and a positive input coupled to ground conductor 30 by means of a resistor. Operational amplifier 17 has an output terminal 18, whereat output voltage $V_{OUT}$ (which represents the numerical value of a digital word applied to buses 32, 34) is produced. A resistor feedback network including resistors 21 and 22 provides two alternate feedback paths from output terminal 18 for controlling the magnitude of the voltage range of $V_{OUT}$. Resistors 24 and 26 can be utilized to compensate for differences in ground reference voltages between ground conductor 30 and ground conductors of a system (not shown) to which system 10 is connected.

DAC subsystem 12 includes a precision voltage reference 86 connected to main DAC 16 for controlling the magnitude of DAC output current $I_{OUT}$ flowing into terminal 20. Six "adjustment inputs" indicated by reference numerals 56', 57', 58', 59', 60' and 61' are utilized to trim or adjust the components of $I_{OUT}$ controlled by the four most significant bits of main DAC 16, to adjust the offset, and to adjust the gain, respectively, of main DAC 16.

Bus 32 includes eight conductors which are connected to eight inputs of main DAC 16, which conductors are connected to the respective outputs of eight three-state latches 37. Similarly, bus 34 includes eight conductors connected to eight additional inputs of DAC 16 and also connected to the respective outputs of eight three-state latches 39. The inputs of the eight latches represented by reference numeral 37 are connected, respectively, to eight conductors of bus 42, which is connected to an electronic system (not shown) in which system 10 is operatively connected. Similarly, the inputs of the eight latches represented by reference numeral 39 are connected, respectively, to the outputs of eight three-state latches 41 having their respective inputs connected to the eight conductors of bus 44, which is also connected to the electronic system (not shown). (The eight conductors of bus 42 also can be connected to inputs of three-state latches 41 so that inputs 44 can be omitted, if it is desired to connect system 10 to an "eight bit" electronic system rather than a "sixteen bit" electronic system.) Conductor 47 is connected to the enable inputs of three-state latches 41 in order to enable the eight least significant bits (LSBs) of a digital input word to be outputted from three-state latches 41 onto conductors 45 to the inputs of three-state latches 39. Similarly, conductor 46 is connected to enable inputs of latches 37 and 39 to apply the information stored in latches 37 and 39 to buses 32 and 34, respectively.

System 10 includes a calibration subsystem 14 which includes three-state input latches or digital input means 37, 39, and 41 and also includes four "bit adjustment" DAC's or adjusting means 56, 57, 58, and 59 connected to respective ones of the above mentioned "adjustment inputs" 56',57', 58', and 59' of main DAC 16. Calibration subsystem 14 also includes an "offset adjustment" DAC 60 connected to "offset adjust" input 60' of main DAC 16 and a "gain adjustment" DAC 61 connected to "gain adjustment" input 61' of main DAC 16. "Bit adjustment" DACS 56, 57, 58, and 59, "offset adjustment" DAC 60 and "gain adjustment" DAC 61 all include input latches (not shown) which are capable of storing correction codes conducted by bus 65. Such correction codes are entered into the subject input latches when the respective DAC's are enabled by enable conductors 56", 57", 58", 59", 60" and 61". Calibration subsystem 14 further includes a latch circuit 72, which includes 14 latches having their respective outputs connected to corresponding inputs of "offset" DAC 74 or first conversion means 74. The output of "offset" DAC 74 is connected to a negative input of difference amplifier or comparison means 77, which has a positive input connected to conductor 84. Difference amplifier 77 is actually of a type known as an instrumentation amplifier in the present embodiment of the invention. Conductor 84 is connected to the output of a single pole, triple throw analog switch 82 having three switchable inputs connected to conductors 87, 18, and 30 so that any one of the precision reference voltage, $V_{OUT}$, or ground voltage can be applied to the positive input of difference amplifier 77.

The output difference amplifier 77 is connected to an analog to digital converter (ADC) or second conversion means. ADC 79 is a twelve bit ADC having its twelve digital outputs 79' connected to the inputs of twelve three-state latches collectively represented by reference numeral 80.

The above described three-state latches, "bit adjustment" DAC's, "offset adjustment" DAC, "gain adjustment" DAC, latches 72, and analog switch are all controlled by microprocessor system 63. (It should be noted that any suitable type of processor oriented or computer oriented system could be used; microprocessors are readily available and are used in the described embodiment of the invention). Microprocessor system 63 includes a microprocessor or computing means, a read only memory used for storing a control program, and a random access memory or storing means. Microprocessor system 63 has a plurality of control inputs, such as "Interrupt" and "Reset" inputs, collectively represented by reference numeral 69, and a status output 70. Microprocessor system 63 has a plurality of Input/Output (I/O) terminals connected to the respective conductors of buses 65 and 67. The respective conductors of buses 65 and 67 are connected to the inputs of sixteen three-state latches collectively designated by reference numeral 49. The conductors of bus 67 are also connected to the respective outputs of eight three-state latches in block 80. Four of the conductors of bus 65 are connected to the respective outputs of four remaining latches in block 80. The conductors of bus 67 are also connected to the eight digital inputs of each of the "bit adjustment" DAC's 56, 57, 58, and 59, "offset adjustment" DAC 60 and "gain adjustment" DAC 61, and to the respective inputs of eight latches contained in block 72. Six of the conductors of bus 67 are connected to the respective inputs of six additional latches in block 72. Microprocessor system 63 provides a number of output control signals on a group of conductors collectively referred to as control bus 54. One of the conductors of control bus 54 designated by reference numeral 50 is connected to enable the latches in block 49 and also to an input of inverter 52. The output of inverter 52 is connected to enable the three-state latches in blocks 37 and 39. Thus, micrprocessor system 63 can isolate buses 32 and 34 from latches 37 and 39 and then apply stored information (precisely written into the three-state latches in block 49 via conductors 65 and 67) to the digital inputs of main DAC 16 connected to the conductors of buses 32 and 34.

Another conductor of control bus 54 is connected to enable the three-state latches in block 49. Further, individual conductors of control bus 54 are respectively connected to the enable inputs 56", 57", 58", 59", 60" and 61" of adjustment DAC's 56, 57, 58, 59, 60, and 61. Another conductor of control bus 54 is applied to enable the latches in block 72. Another three conductors of control bus 54 collectively designated by reference numeral 55 are applied as selection inputs to analog switch circuitry 82 to electrically connect output conductor 84 to a selected one of input conductors 87, 18 and 30.

The components shown in FIG. 1 may be implemented utilizing devices which are commercially readily available. For example, the three-state latches in blocks 37, 39, 41 and 49 can be implemented utilizing series 74LS373 integrated circuits, which are manufactured by various semiconductor companies. Operational amplifier 17 can be implemented utilizing a precision operational amplifier Model OP-01H, manufactured by Precision Monolithics Corp. Precision voltage reference 86 can be implemented utilizing a temperature stabilized monolithic zener reference manufactured by National Semconductor Corporation and designated as Model LM199A. The "adjustment" DAC's 56, 57, 58, 59, 60, and 61 can be implemented utilizing inexpensive Signetics Model 5018 eight bit DAC's. Microprocessor system 63 can be implemented utilizing a Mostek 3870 microprocessor. Difference amplifier 77 can be implemented utilizing the Burr-Brown Model 3630 instrumentation amplifier. Analog to digital converter 79 can be implemented utilizing a Burr-Brown Model ADC80 analog to digital converter. "Offset" DAC 74 can be implemented utilizing a fourteen bit Burr-Brown DAC71 digital to analog converter. The latches in block 72 can be implemented utilizing Series 74LS273 integrated circuit latches. Analog switch 82 can be implemented utilizing a Siliconix DG-170 analog switch. A device identical to main DAC 16 is not yet available on the market, since presently available sixteen bit DAC's do have the "adjustment inputs" 56', 57', 58', 59', 60', and 61' only as internal nodes, but not provided as external inputs. However, various presently available sixteen bit DAC's, such as the MP8116 manufactured by Analogic Corporation, modified to provide "adjustment inputs" 56', 57', 58', 59', 60', and 61' as external inputs could be utilized to implement main DAC 16. The assignee of this application is presently developing a suitable sixteen bit DAC to be designated as the SM10173 D/A converter submodule.

The detailed calibration procedure implemented by system 10 is accomplished by first adjusting $V_{OUT}$ (FIG. 1) by an amount sufficient to compensate for the offset of main DAC 16. This is accomplished by adjusting current out of "offset adjustment" input 60' of DAC 16 so that $V_{OUT}$ equals the ground reference voltage when all "zeros" are applied to the conductors of buses 32 and 34. Next, the four "bit adjustment" inputs 59', 58', 57', and 56' are sequentially adjusted in that order to linearize $V_{OUT}$ as a function of linear increases in the value of the number represented by the digital input word applied to the digital inputs of DAC 16. Finally, the gain of DAC 16 is calibrated by adjusting the "gain adjustment" input 61' to adjust $V_{OUT}$ in relationship to the precision reference voltage produced by precision voltage reference source 86 when all "ones" are applied to the conductors of buses 32, 34 by microprocessor system 63.

Referring now to FIG. 2A, initially an operating algorithm stored in microprocessor 63 electrically isolates main DAC 16 from the conductors of buses 42 and 44 by producing a logical "one" on conductor 50, enabling the three-state latches in block 49, producing a "zero" on the output of inverter 52, thereby causing the three-state latches in blocks 37 and 39 to assume their high output impedance state. Thus, the conductors in buses 32 and 34 are electrically coupled to the outputs of the three-state latches in block 49 so that the contents thereof are applied to the respective conductors of buses 32 and 34. At this point, microprocessor 63 "enters" the "offset adjust" algorithm, as indicated by label 90 in FIG. 2A. The algorithm first causes microprocessor 63 to transmit a first pattern of logical "zeros" on all of the conductors of buses 65 and 67, thereby loading "zeros" into the latches in block 49, and causing logical "zeros" to be applied to all sixteen digital inputs of main DAC 16 via the conductors of buses 32 and 34, causing main DAC 16 to produce a first output voltage; this is indicated by block 91 in FIG. 2A. The algorithm causes logical "zeros" to be loaded into the latches of block 72 and causes an enable signal to be applied to conductor 50B of control bus 54, enabling the logical "zeros" to be applied to all fourteen inputs of "offset" DAC 74, as indicated in block 92, causing "offset" DAC 74 to produce a first offset signal.

Essentially simultaneously with the above steps, microprocessor system 63 produces an enable signal on one of conductors 55, causing the ground reference voltage on conductor 30 to be directly connected to the positive input of difference amplifier 77, as indicated in block 93 of FIG. 2A. As indicated by block 94 and decision block 95 in FIG. 2A, main DAC 16 begins conversion of the sixteen logical "zeros" applied at its digital inputs in a well known manner to produce a corresponding output current $I_{OUT}$ flowing through output terminal 20; offset DAC 74 also begins conversion of the logical "zeros" applied to its inputs to produce the above mentioned first offset voltage on conductor 75. Meanwhile, microprocessor system 63 enters into a "wait" loop, continually testing for a status signal from ADC 79 indicating completion of the conversion. It should be noted that DAC's and ADC's normally have enable or "start conversion" inputs which enable the devices or cause them to begin their respective conversion operations. ADC 79 also has an "end conversion" status output to indicate when the conversion is complete. After the conversion by "offset" DAC 74 is completed, the difference between the ground reference voltage signal applied to conductor 84 via analog switch 82 and the offset output voltage on conductor 75 is multiplied by approximately 1000 by difference amplifier 77 to produce a first difference signal, which is then applied to the input of analog to digital converter (ADC) 79. Microprocessor system 63 causes a control signal to be applied to "start conversion" conductor 31, which causes analog to digital converter (ADC) 79 to begin its conversion process. When that conversion process is complete, an enable signal is produced on "end of conversion" conductor 33, causing a first digital word, which is the digital representation of the voltage at the output of amplifier 77, to be stored in twelve latches contained in block 80. The first digital word is transmitted via buses 65 and 67 to microprocessor system 63 and is stored in the random access memory thereof, as indicated by block 96 in FIG. 2A.

Next, microprocessor system 63 causes analog switch 82 to connect conductor 84 to conductor 81, so that $V_{OUT}$ (which is now equal to the first output voltage) is applied to the positive input of amplifier 77, thereby producing a second difference voltage signal which is applied to the input of analog to digital converter 79. Microprocessor system 63 waits in a test loop until analog to digital converter 79 completes its conversion of the amplified second difference voltage signal to produce a second digital word, as indicated by block 98 and decision block 99 of FIG. 2A.

Next, the algorithm causes the first stored digital word to be subtracted from the second digital word (which represents the actual offset voltage of DAC 16) to produce a first comparison word. This process corresponds to block 100 of FIG. 2A. The algorithm then enters decision block 101, wherein microprocessor system 63 tests the first comparison word (produced in accordance with block 100) to determine if the error is zero. If it is, the offset adjust algorithm is exited, as indicated by label 102. However, if the error is not equal to zero, the algorithm enters block 103, and computes a first correction word or code, in accordance with computation algorithm of FIG. 3. The first correction code is then stored by microprocessor system 63. Next, the algorithm transmits the first correction code to the digital inputs of "offset" DAC 60, as indicated in block 104, and exits the "offset adjustment" subroutine, as indicated by label 105. "Offset adjustment" DAC 60 then automatically converts the first correction code to a first analog correction signal which is applied to "offset adjustment" input 60' of main DAC 16, thereby causing $V_{OUT}$ to be adjusted to precisely equal the voltage on ground conductor 30. It should be noted that the above process can be repeated if desired to achieve increased accuracy, since the initial error of the second computation would be much smaller than for the above described first offset adjustment calibration procedure. This would be especially desirable if the initial difference between the positive and negative inputs of difference amplifier 77 were sufficiently larege to cause operation outside the linear output range of difference amplifier 77.

Next, the algorithm enters the "bit adjustment" algorithm, as indicated by label 106 in FIG. 2B. The "bit adjustment" algorithm then causes a second pattern of logical signals to be applied to the inputs of main DAC 16. More specifically, the algorithm causes logical "zeros" to be applied to the inputs of the four most significant bits of main DAC 16 and applies logical "ones" to the remaining inputs of main DAC 16, as indicated in block 107. Main DAC 16 converts the second pattern to a second output signal. Microprocessor system 63 also causes "zeros" to be applied to the inputs of the four most significant bits of "offset" DAC 74 and logical "ones" to the other inputs of "offset" DAC 74, as indicated in block 108. "Offset" DAC 74 converts the second pattern to a second offset signal. Next, the algorithm causes microprocessor system 63 to cause analog switch 82 to connect $V_{OUT}$ (conductor 18) to conductor 84, thereby applying $V_{OUT}$ (which is equal to the second output voltage) to the positive input of difference amplifier 77, which produces a third difference signal. This step is shown in block 109 of FIG. 2B. As shown in block 110 and decision block 111 of FIG. 2B, main DAC 16, "offset" DAC 74 and analog to digital converter 79 all carry out their respective conversion processes until completed, as microprocessor system 63 operates in a test loop awaiting a signal indicating that the last of the subject conversion processes is complete. At this point, a third digital word corresponding to the difference between $V_{OUT}$ and the output voltage of "offset" DAC 74 is computed and stored in the random access memory of microprocessor system 63, as indicated in block 112 of FIG. 2B.

The algorithm then enters block 113, causing microprocessor system 63 to apply a fourth pattern of logical signals, including a logical "one" to the fourth most significant bit of main DAC 16 and logical "zeros" to the remaining inputs of main DAC 16.

As indicated in block 114 and decision block 115, microprocessor system 63 operates in a test loop awaiting the arrival of an indication that main DAC 16 and analog to digital converter 79 have completed their respective conversions. At this point, a fourth digital word produced by analog to digital converter 79 is stored in latches 80.

Next, the algorithm enters block 116, wherein the third reference word produced in block 112 is subtracted from the fourth digital word produced by the most recent conversion of analog to digital converter 79. This procedure produces a second comparison word which represents the change in $V_{OUT}$ corresponding to the difference in value of the two digital words most recently applied to the inputs of main DAC 16 in block 107 and 113. This difference should equal the theoretical change in $V_{OUT}$ corresponding to a "least significant bit change", such change in $V_{OUT}$ hereinafter being referred to as a "LSB voltage change", in the digital word applied to the digital inputs of main DAC 16. If the second comparison word is equal to the digital equivalent of one LSB voltage change, as indicated in decision block 117 of the algroithm, there is no error, and the algorithm exits at label 118. However, if the second comparison word is not equal to the digital equivalent of one LSB voltage change, the algorithm enters block 119, wherein microprocessor system 63 enters a computation algorithm similar to that shown in FIG. 3 and computes a second correction code and stores the second correction code in the random access memory of microprocessor system 63, as indicated in block 119 of FIG. 2B. The algorithm then transmits the second correction code to the digital inputs of "bit adjustment" DAC 59, and exits the bit adjust algorithm label 121. "Bit adjustment" DAC 59 then converts the second correction code to produce a second analog correction signal, which is applied to "bit adjustment" input 59' of main DAC 16, causing $V_{OUT}$ to be adjusted to precisely equal a voltage which is one LSB voltage change greater than the most recent previous value of $V_{OUT}$ produced by main DAC 16.

The procedure of the algorithm of FIG. 2B is in essence repeated for each of the remaining most significant bits of main DAC 16 in increasing significant bit order, except that the steps indicated in blocks 107 and 113 apply to the third most significant bit, then to the second most significant bit, etc. After the most significant bit of main DAC 16 has been calibrated in the manner of the algorithm of FIG. 2B, the linearization calibration procedure is complete. Microprocessor system 63 then jumps to the "gain adjustment" algorithm of FIG. 2C at label 122.

The "gain adjustment" algorithm 122 of FIG. 2C is essentially similar to the offset adjustment algorithm of FIG. 2A, except that in blocks 123 and 124 microprocessor system 63 applies all "ones" to the inputs of main DAC 16 and "offset" DAC 74. In block 125, analog switch 82 is caused to connect the reference voltage on conductor 87 to conductor 84. The reference word stored in block 128 corresponds to the full scale voltage $V_{OUT}$, rather than the ground reference voltage on conductor 30, as in block 96 of FIG. 2A. In block 129, analog switch 82 is connected to $V_{OUT}$, as in block 97.

The steps in blocks 132, 133, 135 and 136 are entirely similar to the corresponding operations in blocks 100, 101, 103, and 104 of FIG. 2A. Thus, the "gain adjustment" algorithm of FIG. 2C causes the full scale value of $V_{OUT}$ to be precisely adjusted with respect to the precision reference voltage produced by circuit 86, which is the only component of FIG. 1 which ever requires manual adjustment.

The computation made in block 103 of FIG. 2A is shown in more detail in the flow chart of FIG. 3, which sets forth the steps involved in computing the first correction code. Referring now to FIG. 3, microprocessor 63 enters the "correction code algorithm" at label 101. After fetching the base address (the first address of a table of correction factors stored in the read only memory of microprocessor system 63) and the first comparison word, microprocesser 63 adds the first comparison word to the base address, as indicated in block 104 of FIG. 3, to obtain the address of the required correction factor. Next, the algorithm causes microprocessor system 63 to address its read only memory (ROM) to fetch the first correction factor, as indicated in block 105. Microprocessor system 63 then generates an enable signal which causes "offset adjustment" DAC 60 to be enabled and outputs the fetched correction factor onto the conductors of bus 65. Offset adjustment DAC 60 then automatically generates the desired correction current into "offset adjustment" input 60' of main DAC 16.

A very similar algorithm to that of FIG. 3 controls the operation of processor system 63 to compute the second correction code referred to in block 119 of FIG. 2B during execution of the "bit adjustment" algorithm previously described. However, one of the adjustment DAC's is selected instead of the "offset adjustment" DAC, so that the computed correction code is received by that "bit adjustment" DAC. Computation of the third correction code, referred to in block 135 of FIG. 2C is also similar to the computation described above with reference to FIG. 3.

Although the invention has been described with reference to a particular embodiment thereof, various other arrangements of elements and operating steps can be made within the true spirit and scope of the invention. For example, those skilled in the art will recognize the order of starting the conversions of the patterns of logic signals to the DAC's connected to buses 65 and 67 can be varied from the order set forth in the foregoing description. Further, the order of connecting the positive input of difference amplifier 77 to $V_{OUT}$ and the ground reference conductor 30 or the precision voltage conductor 87 may be varied from the order described above.

We claim:

1. A method for calibrating a first signal to analog converter, said first digital to analog converter including a plurality of digital inputs and an output terminal for producing an analog output signal, said method comprising the steps of:
   a. applying a first pattern of logic signals to the inputs of the first digital to analog converter, said first digital to analog converter producing a first output signal at said output terminal in response to said first pattern;
   b. performing a digital to analog conversion of a predetermined group of said logic signals of said first pattern to produce a first offset signal;
   c. comparing said first offset signal to a first reference signal and producing a first difference signal representative of the difference between said first offset signal and said first reference signal;
   d. performing an analog to digital conversion of said first difference signal to produce a first digital word;
   e. storing said first digital word;
   f. comparing said first offset signal to said first output signal to produce a second difference signal representative of the difference between said first offset signal and said first output signal;
   g. performing an analog to digital conversion of said difference signal to produce a second digital word;
   h. comparing said first and second digital words to produce a first comparison word;
   i. obtaining a first correction word by utilizing said first comparison word to produce said first correction word from stored correction information which characterizes said first digital to analog converter;
   j. performing a digital to analog conversion of said first correction word to produce a first correction signal; and
   k. adjusting the output signal of said first digital to analog converter in response to said first correction signal to reduce any initial difference between said first output signal and said first reference signal.

2. The method of claim 1 wherein the plurality of digital inputs are coupled, respectively, to a plurality of conductors of an electronic system in which the first digital to analog converter operates to receive a digital input word from the electronic system to convert the digital input word to an analog output signal during normal operation of the electronic system, said method including the step of electrically isolating the plurality of digital inputs from the plurality of conductors before performing step (a).

3. The method of claim 1 further including the steps of:
   a. applying a second pattern of logic signals to the respective digital inputs of the first digital to analog converter, the first digital to analog converter converting said second pattern to produce a second output signal;
   b. performing a digital to analog conversion of a predetermined number of the most significant bit logic signals of said second pattern to produce a second offset signal;
   c. comparing said second output signal to said second offset signal to produce a third difference signal;
   d. converting said third difference signal to a third digital word;
   e. storing said third digital word;
   f. applying a third pattern of logic signals to the digital inputs of the first digital to analog converter, said third pattern having a numerical value greater than the numerical value of said second pattern by one least significant bit, the first digital to analog converter converting said third pattern to produce a third output signal at the output terminal;
   g. comparing said third output signal to said second offset signal to produce a fourth difference signal;
   h. converting said fourth difference signal to a fourth digital word;
   i. comparing said third and fourth digital words to produce a second comparison word;

j. computing a second correction word in response to the difference between said second comparison word and a digital word representative of the desired change of the analog output signal corresponding to a least significant bit change in the numerical value of the digital word applied to the digital inputs; and k. producing a second analog correction signal in response to said second correction word and applying said second analog correction signal to an adjustment input corresponding to the $N_{th}$ bit of the first digital to analog converter, thereby causing the output signal to be adjusted toward a signal different from the second output signal by a predetermined amount corresponding to a least significant bit change in the input word.

4. The method of claim 3 wherein said second pattern includes logical "zeros" applied to the $N_{th}$ and higher most significant bit digital input of the first digital to analog converter, and wherein said second pattern also includes logical "ones" applied to all of the digital inputs of lower significance than the $N_{th}$ most significant bit.

5. The method of claim 3 including repeating steps (a) through (k) for each successively higher one of the higher order significant bit inputs of the first digital to analog converter, increasing N by one for each successively higher bit order significant bit.

6. The method of claim 3 further including the steps of:

a. applying a fourth pattern of logic signals to the inputs of the first digital to analog converter, said first digital to analog converter producing a fourth output signal at said output terminal in response to said fourth pattern;

b. performing a digital to analog conversion of a predetermined group of said logic signals of said fourth pattern to produce a third offset signal;

c. comparing said fourth offset signal to a second reference signal and producing a fifth difference signal representative of the difference between said third offset signal and said second reference signal;

d. performing an analog to digital conversion of said fifth difference signal to produce a fifth digital word;

e. storing said fifth digital word;

f. comparing said second offset signal to said fourth output signal to produce a sixth difference signal representative of the difference between said second offset signal and said fourth output signal;

g. performing an analog to digital conversion of said sixth difference signal to produce a sixth digital word;

h. comparing said fifth and sixth digital words to produce a third comparison word;

i. computing a third correction word in response to said third comparison word;

j. performing a digital to analog conversion to said third correction word to produce a third correction signal; and k. adjusting the output signal of said first digital to analog converter in response to said third correction signal to reduce any difference between said fourth output signal and said second reference signal.

7. The method of claim 6 wherein all of the logic signals of said fourth pattern are logical "ones".

8. The method of claim 1 wherein said comparing of step (c) produces an amplification of the difference between said first offset signal and said first reference signal to produce said first difference signal.

9. The method of claim 1 wherein said first offset signal, and first output signal, said first reference signal, and said first and second difference signals are all voltage signals.

10. The method of claim 1 wherein the order of performing steps (a) through (e) is controlled by means of a digital processor device.

11. The method of claim 10 wherein said storing of step (e), said comparing of step (h) and said obtaining of step (i) are performed by means of said digital processor.

12. The method of claim 1 wherein step (h) includes subtracting one of said first and second digital words from the other.

13. The method of claim 1 wherein said first digital to analog converter includes an offset adjustment input for adjusting said analog output signal, wherein said adjusting of step (k) includes applying said first correction signal to said offset adjustment input.

14. A method for calibrating a first digital to analog converter, said first digital to analog converter including a plurality of digital inputs and an output terminal for producing an analog output signal, said method comprising the steps of:

a. applying a first pattern of logic signals to the inputs of the first digital to analog converter, said first digital to analog converter producing a first output signal at said output terminal in response to said first pattern;

b. performaing a digital to analog conversion of a predetermined group of said logic signals of said first pattern to produce a first offset signal;

c. comparing said offset signal to said first output signal to produce a first difference signal representative of the difference between said first offset signal and said first output signal;

d. performing an analog to digital conversion of said first difference signal to produce a first digital word;

e. storing said first digital word;

f. comparing said first offset signal to a first reference signal and producing a second difference signal representative of the difference between said offset signal and said first reference signal;

g. performing an analog to digital conversion of said second difference signal to produce a second digital word;

h. comparing said first and second digital words to produce a first comparison word;

i. obtaining a first correction word by utilizing said first comparison word to produce said first correction word from stored correction information which characterizes said first digital to analog converter;

j. performing a digital to analog conversion of said first correction word to produce a first correction signal; and k. adjusting the output signal of said first digital to analog converter in response to said first correction signal to reduce any initial difference between said first output signal and said first reference signal.

15. A system for calibrating a first digital to analog converter, said first digital to analog converter including a plurality of digital inputs, and an analog output for producing an analog output signal, said system comprising in combination:
  a. digital input means for applying a first pattern of logic signals to the inputs of the main digital to analog converter, said first digital to analog converter producing a first output signal;
  b. first conversion means for converting a group of the logic signals of said first pattern to a first analog signal;
  c. comparison means for comparing said first analog signal to a first analog reference signal and producing a first difference signal representative of the difference between said first analog signal and said first analog reference signal;
  d. second conversion means for converting said first difference signal to a first digital word;
  e. means for storing said first digital word, said comparison means also comparing said first analog signal to said first output signal and producing a second difference signal representative of the difference between said first analog signal and said first output signal, said second conversion means also converting said second difference signal to a second digital word;
  h. computing means for performing a computation to compare said first and second digital words to produce a first comparison word, said computing means also computing a first correction word in response to said first comparison word;
  i. third conversion means for producing a first analog correction signal in response to said first correction word; and
  j. means for adjusting said first output signal in response to said first analog correction signal to reduce any difference between said first output signal and said first reference signal.

16. The system of claim 15 wherein said first digital to analog converter includes said adjustment means and an adjustment input for receiving said first analog correction signal.

17. The system of claim 15 wherein said first analog reference signal is a ground voltage.

18. The system of claim 15 wherein said first analog reference signal is a precision reference voltage.

19. The system of claim 15 wherein said digital input means, said storing means, and said computing means are all included in a digital processor system.

20. The system of claim 19 wherein said conversion means includes a second digital to analog converter of lower accuracy than said first digital to analog converter.

21. The system of claim 19 wherein said second conversion means is included in an analog to digital converter.

22. The system of claim 19 wherein said fourth conversion means includes a third digital to analog converter of lower accuracy than said first digital to analog converter.

23. The system of claim 19 further including analog switching means responsive to said digital processor system for selectively conducting said first analog reference signal and said first output signal to said first and second comparison means, respectively.

24. The system of claim 15 wherein said digital input means also applies other predetermined digital patterns to the inputs of the main digital to analog converter.

25. The system of claim 15 wherein said first and second comparison means are included in a difference amplifier.

26. The system of claim 15 further including isolation means for electrically isolating said plurality of digital inputs from an electronic system from which said first digital to analog converter receives digital words for conversion into analog signals.

27. A method for calibrating a first analog circuit, said first analog circuit including an input terminal for receiving an input signal and an output terminal for producing an analog output signal, said first analog circuit performing a predetermined operation on the input signal to produce the analog output signal, said method comprising the steps of:
  a. applying a first input to the input terminal, said first analog circuit producing a first output signal at said output terminal in response to said first input signal;
  b. performing a predetermined operation on said first input signal by means of a second analog circuit to produce a first offset signal;
  c. comparing said first offset signal to a first reference signal and producing a first difference signal representative of the difference between said first offset signal and said first reference signal;
  d. storing information representative of said first difference signal;
  e. comparing said first offset signal to said first output signal to produce a second difference signal representative of the difference between said first offset signal and said first output signal; and
  f. adjusting the output signal of said first analog circuit in response to the difference between said first and second difference signal to reduce any initial difference between said first output signal and said first reference signal.

28. The method of claim 27 wherein the first analog circuit includes a digital to analog converter, and said predetermined operations include digital to analog conversions operations.

29. A system for calibrating a first analog circuit, said first analog circuit including an input terminal for receiving an input signal and an output terminal for producing an analog output signal, said first analog circuit performing a predetermined operation on the input signal to produce the analog output signal, said system comprising in combination:
  a. input means for applying a first input to the input terminal, said first analog circuit producing a first output signal at said output terminal in response to said first input signal;
  b. offset means for performing a predetermined operation on said first input signal by means of a second analog circuit to produce a first offset signal;
  c. comparing means for comparing said first offset signal to a first reference signal and producing a first difference signal representative of the difference between said first offset signal and said first reference signal;
  d. storing means for storing information representative of said first difference signal, said comparing means also comparing said first offset signal to said first output signal to produce a second difference signal representative of the difference between said first offset signal and said first output signal; and
  e. adjusting means for adjusting the output signal of said first analog circuit in response to the difference between said first and second difference signals to reduce any initial difference between said first output signal and said first reference signal.

30. The system of claim 29 further including analog to digital conversion means responsive to said comparison means for producing first and second digital words representative of said first and second difference signals, respectively.

31. The system of claim 30 wherein said adjusting means includes a microprocessor system for computing the difference between said first and second digital words and producing a correction signal for reducing said initial difference between said first output signal and said first reference signal in response to said difference between said first and second digital words.

* * * * *

UNITED STATES PATENT AND TRADEMARK OFFICE
CERTIFICATE OF CORRECTION

PATENT NO. : 4,222,107

DATED : September 9, 1980

INVENTOR(S) : Andrij Mrozowski, et al.

It is certified that error appears in the above-identified patent and that said Letters Patent are hereby corrected as shown below:

In Claim 1, first line, delete "signal", substitute --digital--.

Signed and Sealed this

Thirteenth Day of October, 1987

*Attest:*

DONALD J. QUIGG

*Attesting Officer*     *Commissioner of Patents and Trademarks*